US006549584B1

(12) United States Patent
Gatherer et al.

(10) Patent No.: US 6,549,584 B1
(45) Date of Patent: Apr. 15, 2003

(54) CODING SCHEME FOR CABLE MODEMS

(75) Inventors: Alan Gatherer, Richardson, TX (US); Murtaza Ali, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/345,054

(22) Filed: Jun. 30, 1999

(65) Prior Publication Data (65)

(51) Int. Cl.[7] ............................. H04L 5/12; H04L 23/02
(52) U.S. Cl. ........................................ 375/261; 714/755
(58) Field of Search ................................ 375/261, 265, 375/298; 714/777, 784, 786, 790, 792, 755, 756

(56) References Cited

U.S. PATENT DOCUMENTS

| | | | |
|---|---|---|---|
| 5,233,629 A | | 8/1993 | Paik et al. ..................... 375/39 |
| 5,396,518 A | * | 3/1995 | How ............................ 375/265 |
| 5,511,082 A | | 4/1996 | How et al. .................... 371/43 |
| 6,052,821 A | * | 4/2000 | Chouly et al. ............... 714/790 |
| 6,269,129 B1 | * | 7/2001 | Rhee et al. ................... 375/341 |
| 6,351,832 B1 | * | 2/2002 | Wei ............................ 714/701 |

FOREIGN PATENT DOCUMENTS

| | | | |
|---|---|---|---|
| EP | 0 682 415 A1 | 11/1995 | .......... H03M/13/12 |

OTHER PUBLICATIONS

Ungerboeck, "Trellis-Coded Modulation with Redundant Signal Sets: Part I: Introduction", *Communciations*, vol. 25, No. 2 (IEEE, Feb. 1987), pp. 5–11.

Wei, "Two-Level Coding Based on Trellis-Coded Modulation and Reed-Solomon Codes", *Transactions on Communications*, vol. 42, No. 12 (IEEE, Dec. 1994), pp. 3098–3108.

Perkins and Gatherer, "Two-way broadband CATV-HFC networks: state-of-the-art and future trends," *Computer Networks*, vol. 31 (Elsevier, 1999), pp. 313–326.

Yasuda et al., "High Rate Punctured Convolutional Codes for Soft Decision Viterbi Decoding", *Trans. on Communications*, vol. COM-32, No. 3 (IEEE, Mar. 1984), pp. 315–318.

* cited by examiner

*Primary Examiner*—Mohammad H. Ghayour
(74) *Attorney, Agent, or Firm*—Dana L. Burton; W. James Brady; Frederick J. Telecky, Jr.

(57) ABSTRACT

A modem (12) including a least-significant bit convolutional coding scheme is disclosed. In the transmit side of the modem (12), an encoder (28) is included, within which convolutional coders ($35_P$, $35_Q$) are used to each encode one bit of each symbol applied to a phase and amplitude modulation constellation, preferably the least significant bits, such that the encoded bits select one of a plurality of sub-constellations in the modulated signal. Each of the coders (35, 35') are arranged as finite state machines, of either thirty-two or sixty-four states. The minimum Hamming distance ($d_{free}$) provided by the codes is four, such that the resulting coding gain of the modem is improved over conventional encoding schemes.

17 Claims, 5 Drawing Sheets

CODING SCHEME FOR CABLE MODEMS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of data communications, and is more specifically directed to coding techniques for high data rate transmissions via cable modems.

In the field of data communications, particularly in the provision of Internet access to homes, the use of the cable television (CATV) network as the medium of communication has become attractive. The attractive features of the CATV network include the relatively large installed base of homes having cable television service, and also the inherently high data rates that may be carried by the coaxial cable with which cable television programs are delivered, especially when compared with twisted-pair copper wiring commonly used in telephone service. As such, significant effort has been undertaken to develop the appropriate technology for two-way broadband communication over the CATV network. Attention is directed, in this regard, to Perkins and Gatherer, "Two-way broadband CATV-HFC networks: state-of-the-art and future trends", *Computer Networks*, Vol. 31 (Elsevier Science B.V., 1999), pp. 313–326, for a survey of the current state of technology in this field.

An important measure of any high-data-rate communications approach is referred to as "spectral density", or synonymously as "spectral efficiency". Spectral density refers to the number of bits that may be communicated per second for a given frequency. Of course, the higher the spectral density, the more information that can be communicated at the transmission frequency. In recent -years, relatively complex modulation techniques have been developed to improve the spectral density of data communications. It is now commonplace for communications to be carried out using phase and amplitude modulation, in combination, to modulate digital data into the transmitted signal. As is fundamental in such modulation, a "constellation" is defined by a number of discrete points in complex Euclidean space, each point representative of a value of a data symbol. An example of a complex modem constellation, referred to in the art as 256 QAM, has 256 points mapped into a sixteen-by-sixteen array in complex space; this constellation thus. permits the transmission of eight-bit symbols, and provides excellent spectral density.

As is also well-known in the art, the spectral density of a transmission scheme is limited by the noise in the transmission channel. If the noise is excessive, constellation points may be mistaken for one another, resulting in. an error in the transmission. As spectral density increases (i.e., with more points in the complex space constellation), the distance between adjacent constellation points decreases; for a given level of noise, a smaller distance between adjacent points directly relates to the likelihood of a transmission error.

Redundant encoding techniques have been used in combination with phase and amplitude modulation to ease the tradeoff between spectral density and error rates. One encoding technique is referred to as "trellis" coding, which is a species of convolutional encoding. A survey of trellis coding is described in Ungerboeck, "Trellis-Coded Modulation with Redundant Signal Sets Part I: Introduction", *IEEE Communications Magazine*, Vol. 25, No. 2 (1987), pp. 5–11. According to trellis coding techniques, the constellation is divided into subsets, but the signal transitions are limited by way of a finite state machine. In this way, depending upon the particular implementation, transitions are not permitted to neighboring points in the constellation in every state, while transitions from state to state are permitted so that all points in the available constellation are used with equal frequency. The use of the finite state machine thus includes the value of prior symbols into the determination of the output signal, providing controlled redundancy in the encoding scheme. In trellis coding, only a portion of the bits of the symbol are encoded while the remaining symbol bits are transmitted in an uncoded fashion. The coded bits select the constellation subset to which the symbol relates, while the uncoded bits indicate the particular point within the selected constellation subset corresponding to the symbol. Because of the subdivision of the constellation, however, the Euclidean distance between the uncoded bits is increased. In other words, for a given bit error rate, the signal-to-noise ratio required using trellis coding may be a few dB less than for the uncoded case.

Figure 1:
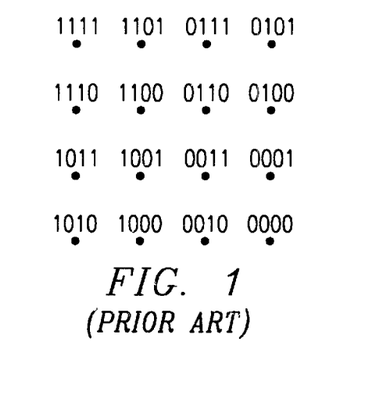
FIG. 1 is a constellation map illustrating a conventional 16-QAM phase amplitude modulation constellation.

By way of further background, U.S. Pat. No. 5,511,082 describes a method and apparatus for encoding digital data using a convolutional code to encode part of the transmitted symbols. The convolutional code in this example has a coding rate of 4/5, which indicates that one redundant bit is inserted for every four symbol bits to be encoded. An extension of this approach is used in the trellis coding specified for cable modems according to ITU-T Recommendation J.83 Annex B, and in other cable modems specifications. In this approach, four constellation subsets are used, with the two least significant bits being coded according to a convolutional code, with the coded result used to select among the constellation subsets. FIG. 1 illustrates an example of this methodology, as utilized in a simple 16-QAM context. As evident from FIG. 1, the least significant bit of the codeword alternates along the imaginary axis of the constellation, and the second least significant bit alternates along the real axis. Considering the two LSBs to indicate the selection of the sub-constellation (e.g., all points xx01 correspond to one sub-constellation or subset), it is evident from FIG. 1 that adjacent points within a sub-constellation are significantly separated from one another than are adjacent points in the overall 16-QAM constellation. In this example, this approach doubles the Euclidean distance between adjacent uncoded constellation bits (providing a 6 dB improvement in error performance).

Figure 2:
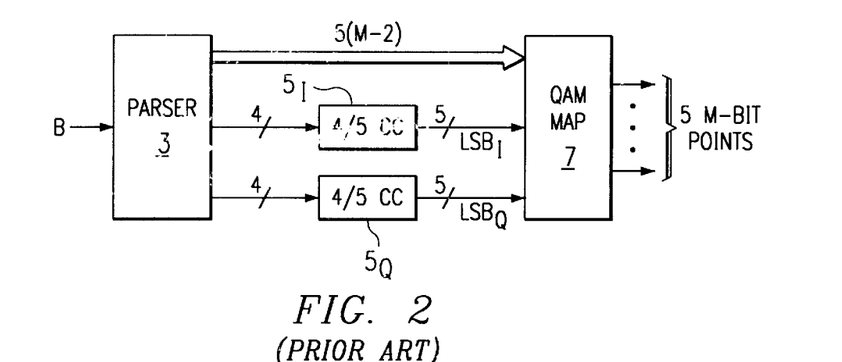
FIG. 2 is an electrical diagram, in block form, of a conventional coder for cable modem transmission.

FIG. 2 illustrates, in block diagram form, the coder functions used to implement this LSB encoding approach described in U.S. Pat. No. 5,511,082. Parser 3 receives a bitstream B, and parses the incoming bitstream B into m-bit symbols, considering the coding. In this example, where 4/5 convolutional coders $5_I$ and $5_Q$ are used, five m-bit symbols are to be generated at a time; as such, parser 3 forwards 5(m−2) bits in uncoded fashion to QAM map function 7. Parser 3 also forwards four bits to 4/5 convolutional coder $5_I$, and four bits to 4/5 convolutional coder $5_Q$.

Figure 3:
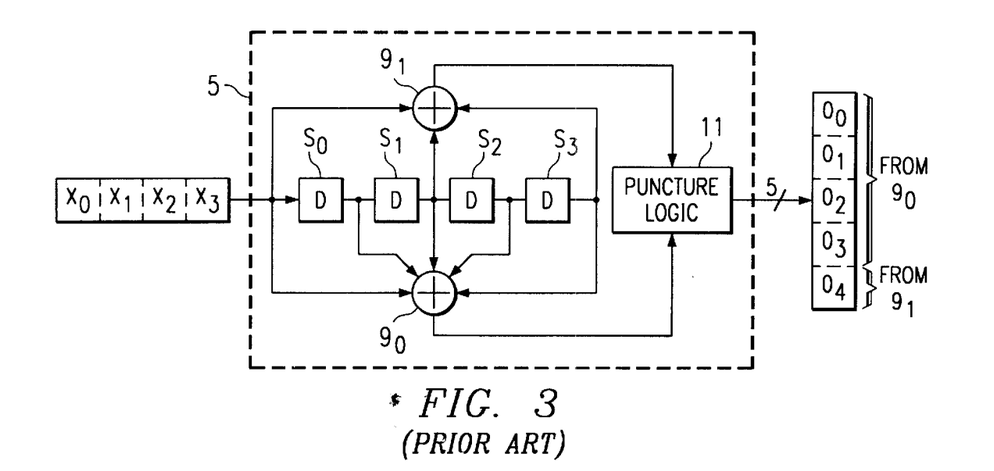
FIG. 3 is an electrical diagram, in block and schematic form, illustrating the construction of a conventional 4/5 convolutional coder in the coder of FIG. 2.

FIG. 3 illustrates the functional construction of one of 4/5 convolutional coders $5_I$ and $5_Q$ which, of course, are similarly constructed. As shown in FIG. 3, four input bits $x_0$ through $x_3$ are serially presented (bit $x_3$ being earliest in time, and bit $x_0$ latest) to convolutional coder 5. Convolutional coder 5 includes four delay stages $S_0$ through $S_3$, the outputs of which are applied to exclusive-OR functions $9_0$ and $9_1$ according to the desired encoding. In this example, exclusive-OR function $9_0$ receives the outputs of all four delay stages $S_0$ through $S_3$ and also the currently applied input bit, and exclusive-OR function $9_1$ receives the currently applied input bit, and the outputs of delay stages $S_1$ and $S_3$. As described in the above-referenced U.S. Pat. No. 5,511,082, this arrangement corresponds to octal generators of $25_8$ ($10101_2$) and $37_8$ ($11111_2$), for exclusive-OR functions $9_0$ and $9_1$, respectively.

The outputs of exclusive-OR functions 9 are applied to puncture logic 11, which selects the bits to be output by coder 5 according to the desired puncture scheme. In this example, puncture logic 11 selects each of the four bits output by exclusive-OR function $9_0$ from the sequence of four input bits $x_0$ through $x_3$, and only the fourth (last) bit output by exclusive-OR function $9_1$. As described in the above-referenced U.S. Pat. No. 5,511,082, a puncture map is described for this arrangement as:

$$\begin{Bmatrix} 1 & 0 & 0 & 0 \\ 1 & 1 & 1 & 1 \end{Bmatrix}$$

The five output bits from puncture logic 11 are illustrated, in FIG. 3, as bits $O_0$ through $O_4$. In this arrangement, output bits $O_0$ through $O_3$ are derived in sequential order (bit $O_0$ being earliest in time) by exclusive-OR function $9_0$, and output bit $O_4$ is derived by exclusive-OR function $9_1$ (at a time coincident with bit $O_3$ from exclusive-OR function $9_0$).

One may readily derive the output bits O from the construction of coder 5. In this example, where the initial state of coder 5 is represented by the outputs of delay stages $S_0$ through $S_3$, output bits $O_0$ through $O_4$ correspond to the following logical exclusive-OR operations:

$O_0 = x_3 \oplus S_0 \oplus S_1 \oplus S_2 \oplus S_3$ $O_1 = x_2 \oplus x_3 \oplus S_0 \oplus S_1 \oplus S_2$ $O_2 = x_1 \oplus x_2 \oplus x_3 \oplus S_0 \oplus S_1$ $O_3 = x_0 \oplus x_1 \oplus x_2 \oplus x_3 \oplus S_0$ $O_4 = x_3 \oplus S_0 \oplus S_1 \oplus S_2 \oplus S_3$ One may readily derive a state table for coder 5 according to this conventional construction.

The improvement in error reduction provided by this conventional coding approach may be analyzed by determining the extent to which the Euclidean distance is increased between adjacent points in the same sub-constellation (uncoded bit error), and also the Euclidean distance between the sub-constellations themselves (coded bit error or, conversely, coding gain). In effect, one may consider the error reduction (or gain) by identifying the smallest Euclidean distance of each of these two error types.

For the uncoded bits, considering d as the Euclidean distance between adjacent points in the overall constellation (i.e., union of all four sub-constellations), analysis of this conventional 4/5 convolutional coding approach of FIGS. 2 and 3 has shown, according to the present invention, that the closest two uncoded points (i.e., those communicated directly to QAM map function 7 in FIG. 2) are separated by Euclidean distance 2d.

For the coded bits, the analysis considers the Euclidean distance of errors that occur along a "path" (in the Viterbi decoding sense) in such a manner as to be not detected. Because the 4/5 convolutional code is linear, the error may be analyzed relative to any state; for convenience, the analysis described herein will correspond to erroneous departure from and return to state 0000 ($S_3$ through $S_0$). As noted above, in the conventional approach of FIGS. 2 and 3, the least significant bits are coded, such bits being separated by Euclidean distance d in the constellation. Accordingly, for a minimum number of errors necessary to depart and return to a given state, commonly referred to as the minimum Hamming distance $d_{free}$ (or "free Hamming distance"), the square of the coded Euclidean distance is $\geq d_{free} d^2$.

As noted above, because the overall error improvement corresponds to the smaller of the Euclidean distances of the coded and uncoded portions of the communicated bits, the coding performance will correspond to the smaller of $2^2 d^2$ (the square of the Euclidean distance for the uncoded bits) and $d_{free} d^2$ (the square of the coded Euclidean distance). Accordingly, if the minimum number of errors in the LSBs that can cause an undetected error (i.e., the minimum Hamming distance $d_{free}$) is less than four, the convolutional coding will limit the overall trellis coding performance.

It has been found, according to the present invention, that this conventional trellis coding approach of FIGS. 2 and 3 is indeed limited by the 4/5 convolutional coding. Analyzing state 0000, it is observed that the output bits O contain at least two bits at a "1" level. As such, the Hamming distance H upon leaving state 0000 is >1. Conversely, it is observed that no all zero outputs are present upon entering state 0000, and as such the Hamming distance H upon entering state 0000 is $\geq 1$. The total distance involved in leaving and returning to state 0000 is thus greater than two; it can be readily derived by those in the art, having reference to this description, that the minimum Hamming distance $d_{free}$ according to this conventional 4/5 convolutional coding is three (i.e., $d_{free}=3$).

One may consider the coding "gain" by analysis of the number of transmitted bits in the transmitted constellation. The power in an m-bit pulse-amplitude modulated (PAM) constellation, for the case where the Euclidean distance d=2 (i.e., where the available PAM points correspond to ±1, ±3, ±5, . . . ), is:

$$\frac{2^{2m} - 1}{3}$$

In the conventional arrangement of FIGS. 2 and 3, one may readily see that 5 m-bit symbols are transmitted by QAM map function 7, in place of the 4 m-bit symbols plus one m−1 bit symbol that would have been sent without coding (i.e., the number of bits parsed by parser function 3 is 4m+(m−1)). In other words, the coding arrangement inserts one additional bit in its constellation. One may derive the power increase required as a result of this additional constellation bit as the ratio of the coded PAM power to the uncoded PAM power as follows:

$$\frac{5 \frac{2^{2m}-1}{3}}{4 \frac{2^{2m}-1}{3} + \frac{2^{2(m-1)}-1}{3}} = \frac{5}{4 + \frac{2^{2(m-1)}-1}{2^{2m}-1}} \approx \frac{5}{4 + \frac{1}{4}} = \frac{20}{17}$$

In order to maintain the transmission power within the specified power constraint, this power increase necessitates a reduction in the effective coding gain. For the example where the coding gain is 3 (or 10 $\log_{10}$ 3 dB), the effective coding gain provided by this conventional 4/5 convolutional LSB coding scheme is reduced to 4.07 dB (i.e., 10 $\log_{10}$ 3–10 $\log_{10}$ (20/17)), which is less than the 6 dB improvement that this approach provides the uncoded bits. As such, it has been observed, according to the present invention, that the performance of the technique described in U.S. Pat. No. 5,511,082 is limited by its convolutional coding gain.

By way of further background, it is known that the performance of a trellis-coded modulation implementation may be improved by increasing the number of trellis states in the coding, until the minimum squared Euclidean distance (MSED) between valid sequences of subsets of the constellation exceeds the MSED within a constellation subset. Attention is directed, in this regard, to Wei, "Two-Level Coding Based on Trellis-Coded Modulation and Reed-Solomon Codes", *IEEE Trans. on Communications*, Vol. 42, No. 12 (December, 1994), pp. 3098–3108. However, the sixteen-state trellis coding approach described in U.S. Pat. No. 5,511,082 has been adopted by the International Telecommunications Union (ITU), as Annex B of proposed designation J.83. It has been heretofore believed in the art that additional coding gain is not available from increasing the number of states in the convolutional coding implementation according to this approach.

By way of further background, Yosuda et al., "High Rate Punctured Convolutional Codes for Soft Decision Viterbi Decoding", *Trans. on Communications*, Vol. COM-32, No. 3 (IEEE, March 1984), pp. 315–318, provides a table of punctured codes, including rates and minimum Hamming distances $d_{free}$ for these codes. As evident therein, a convolutional code of 4/5 code rate exists which has a $d_{free}$ of 4, thus providing a coding gain of 5.31 dB (following the above analysis).

BRIEF SUMMARY OF THE INVENTION

It is therefore an object of the present invention to provide improved coding gain in the convolutional coding of communicated data.

It is a further object of the present invention to provide a telecommunications system, modems therein, and methods of operating the same, that provide such improved coding gain.

It is a further object of the present invention to provide such a system, modems, and methods in which the improved convolutional coding may be implemented with little cost.

It is a further object of the present invention to provide such benefits that are particularly well-suited for cable modem communications.

Other objects and advantages of the present invention will be apparent to those of ordinary skill in the art having reference to the following specification together with its drawings.

The present invention may be implemented into the convolutional coding of data to be transmitted and received over a communications network, such as between modems communicating data over coaxial cable or another high-speed medium. According to the present invention, modems in the communication network operate according to a convolutional coding scheme having thirty-two or sixty-four states, with a Hamming distance in each case of four. These coding schemes provide sufficient coding gain to exceed the Euclidean distance within the constellation subsets, and are also backward-compatible with conventional coding schemes.

DETAILED DESCRIPTION OF THE INVENTION

As will become apparent from the following description, it is contemplated that the present invention provides particular advantages in connection with the operation of cable modems to transmit computer-readable data over a cable television (CATV) network. As such, the preferred embodiment of the invention will be described in detail with reference to such a network. However, it is contemplated that those of ordinary skill in the art having reference to this specification will be readily able to implement the present invention to advantage in other communication systems. It is therefore to be understood that the following description is presented by way of example only.

Figure 4:
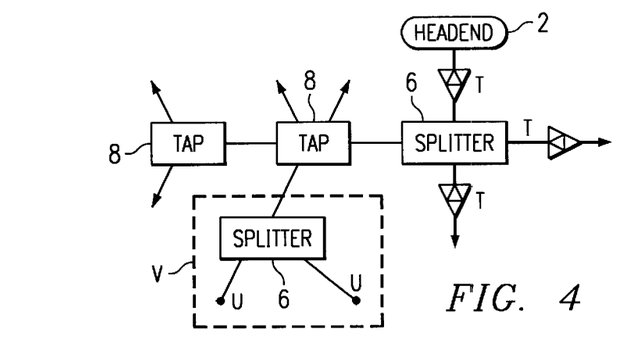
FIG. 4 is a system topology diagram of a cable television (CATV) network into which the preferred embodiment of the invention may be implemented.

FIG. 4 illustrates an example of a system topology of a cable television (CATV) network incorporating the preferred embodiment of the invention. As illustrated in FIG. 4, headend 2 is a cable company office from which the CATV programming is forwarded to the cable subscribers, illustrated in FIG. 4 as users U; as such, headend 2 will receive video programming signals by way of satellite transmission, land line, or the like. Headend 2 forwards these signals to users U by way of a "tree" network that includes trunks T, splitters 6, and taps 8. As illustrated in FIG. 4, splitters 6 may be located on either side of taps 8, such as within a locality L which may be a building or city block. The transmission medium in a network such as that illustrated in FIG. 4 is typically coaxial cable; however, in recent years, some cable systems utilize fiber optic links as trunks T, at least in part, giving rise to the so-called Hybrid Fiber Coax (HFC) infrastructure.

The system of FIG. 4 is, of course, well-suited for the unidirectional transmission of information from headend 2 to users U. As previously noted, however, CATV networks are now increasingly being used to provide users U with access to the Internet, in which case bidirectional communication is carried out. Such bidirectional communication can be readily carried out over the CATV network topology of FIG. 4, by the use of cable modems at the locations of users U. The coaxial cable or HFC infrastructure is readily able to carry high data rate transmissions, such as useful in Internet access and use, especially compared against conventional telephone networks that utilize twisted-pair conductors as the transmission facility.

Figure 5:
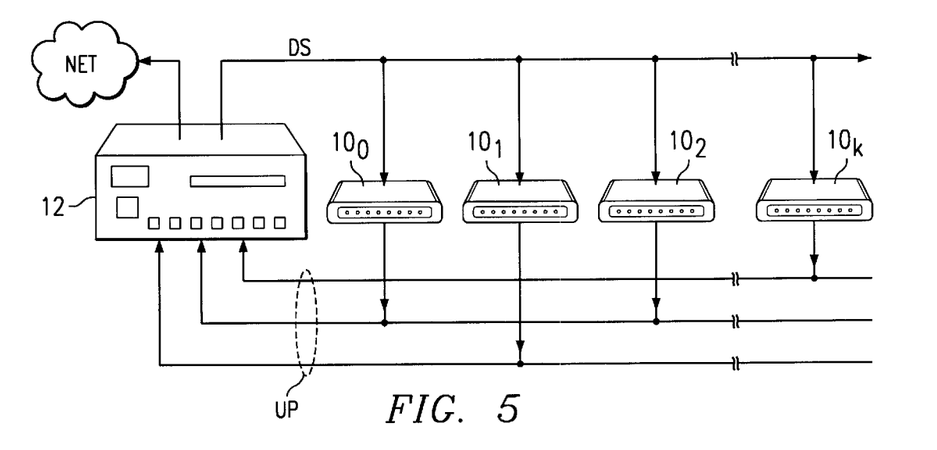
FIG. 5 is a logical topology diagram of a cable modem network in the system of FIG. 4, and into which the preferred embodiment of the invention may be implemented.

FIG. 5 illustrates an example of the logical topology of a cable modem network, such as may be implemented into the system topology exemplified in FIG. 4. As illustrated in FIG. 5, central office modem 12, which is located at the headend 2 in the system topology of FIG. 4, is connected on one side to the Internet, and on another side-to cable modems $10_0$ through $10_k$ at user locations (such as users U in the system topology of FIG. 4). Each cable modem 10 is, of course, connected to a user or client computer system (not shown) at which data is displayed and entered. Downstream path DS carries the transmission of Internet and other computer-readable data from central office modem 12 to cable modems 10, as shown in FIG. 5. Each of cable modems 10 is assigned an individual address, such that it can detect its own downstream data upon downstream path DS for receipt, and filter out the data intended for the others of cable modems 10; as such, downstream data is effectively broadcast over downstream path DS. Central office modem 12 is the exclusive transmitter of data to cable modems 10 (i.e., cable modems 10 will not communicate with one another directly, but instead may only communicate with one another via central office modem 12 or the Internet itself), and as such no downstream media access control (MAC) mechanism is required in this logical arrangement.

Each of cable modems 10 communicate with central office modem 12 over a number of upstream channels, indicated collectively as upstream path UP in FIG. 5. Each upstream channel within path UP may be shared by multiple cable modems 10, and as such central office modem 12 will include functionality to allocate upstream channels, and slots therewith; additionally, because multiple upstream channels are received by central office modem 12 over upstream path UP, a media access control (MAC) mechanism is provided therewithin. The MAC operation, particularly in allocating upstream communication slots and managing upstream timing, utilized in the network of FIG. 5 is described in Perkins and Gatherer, "Two-way broadband CATV-HFC networks: state-of-the-art and future trends", *Computer Networks*, Vol. 31 (Elsevier Science B.V., 1999), pp. 313–326, incorporated herein by this reference.

Figure 6:
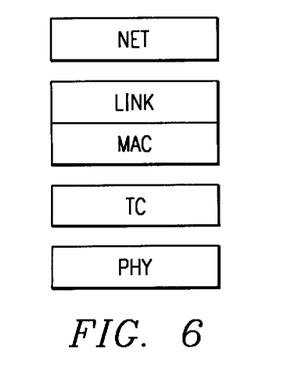
FIG. 6 is a layer diagram, illustrating the relationship of the protocol layers in the cable modem system of FIG. 5.

FIG. 6 illustrates the relationship of the protocol layers in the bidirectional communication in the cable modem system of FIG. 5. Physical layer PHY consists of central office modem 12 and the users' cable modems 10, each of which typically operate according to time division multiple access (TDMA) techniques. Transmission convergence layer TC is a sublayer, located between physical layer PHY and media access control layer MAC, that serves to acquire and lock onto the timing of upstream communications; transmission convergence layer TC is especially important considering the wide range of distances over which cable modems 10 may be installed from central office modem 12. Media access control layer MAC, as noted above, controls the scheduling and allocation of the bandwidth of the shared upstream channels, in the conventional manner; additionally, each cable modem 10 has a unique 48-bit MAC address, and as such media access control layer MAC operates in cable modems 10 to ensure that the desired downstream communicates are received at the addressed cable modem 10. Link layer LINK is implemented in central office modem 12, and links the communications, in both the upstream and downstream directions, to Internet layer NET in this example.

Figure 7:
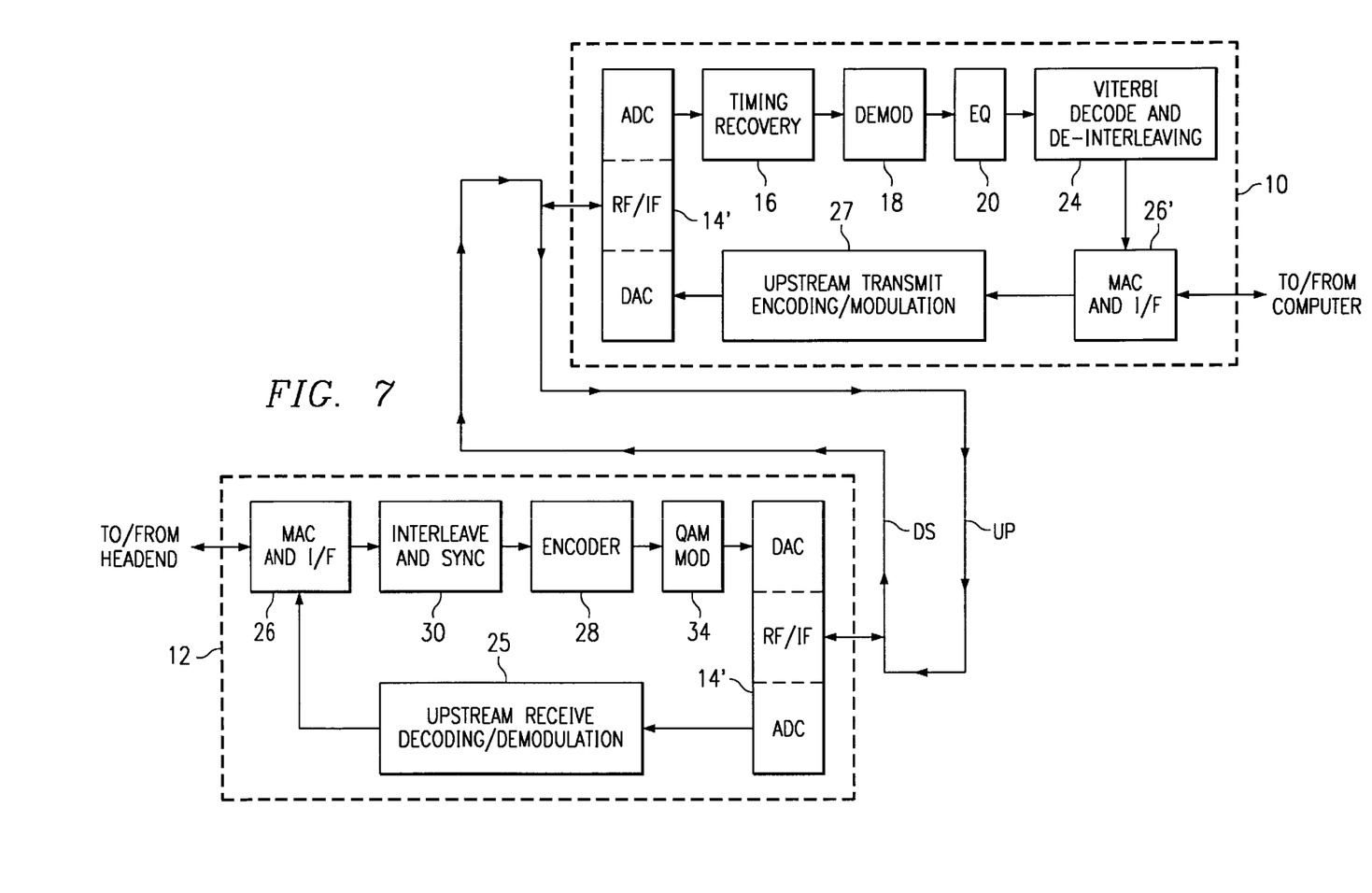
FIG. 7 is an electrical diagram, in block form, of a cable modem in the network of FIG. 5, constructed according to the preferred embodiment of the present invention.

FIG. 7 illustrates the construction, according to the preferred embodiment of the present invention, of an exemplary cable modem 10, in combination with an exemplary central office modem 12 such as may be located at the headend 2 in the system topology of FIG. 4. It is to be understood that the present invention may be readily implemented into cable modems of any one of many architectures, and that as such, cable modem 10 and central office modem 12 illustrated in FIG. 7 are presented by way of example only. Further examples of cable modem architectures, in which the present invention may be readily realized, are described in McGoldrick, "Super chip is the first to get the cable modem down to size", *Electronic Design* (June, 1997); Goldberg, "IC opens 500-channel frontier to cable systems", *Electronic Design* (November, 1994); VES4613 64/256 QAM Subsystem product brochure (VLSI Technologies, May 1995); Samuelli, "Update on Silicon IC Technology for Downstream 64-QAM Transmission," *IEEE Project* 802.14 *Cable TV Protocol Working Group*, Document #IEEE 802.14-96/ 095 (March, 1995).

Additionally, while the example of FIG. 7 illustrates the functional blocks within cable modem 10 and central office modem 12, it is contemplated that these functions are preferably realized, in large part, by way of digital signal processor (DSP) integrated circuits in both cable modem 10 and central office modem 12. Examples of high-performance DSP integrated circuits that are particularly well-suited for use in cable modem 10 and central office modem 12 include the TMS320C6x digital signal processor family available from Texas Instruments Incorporated. In such a realization, several of the functional blocks of each of cable modem 10 and central office modem 12 that are illustrated in FIG. 7 will thus not correspond to separate hardware circuits, but will instead correspond to functions or routines performed by the DSP integrated circuit, under the control of program instructions. In such an arrangement, the digital functions described herein will typically be performed by the DSP, with special function integrated circuits typically used to perform the analog and mixed-signal functions, such as those involved in the modulation and demodulation of the signals, signal conversion between the analog and digital domains, and the like. For purposes of clarity, the following description of cable modem 10 and central office modem 12 will be in terms of the functional blocks of FIG. 7.

The preferred embodiment of the present invention is particularly concerned, in the cable modem context, with the transmit side of central office modem 12 and the receive side of cable modem 10, both of which will now be described in detail relative to FIG. 7. As illustrated in FIG. 7, interleave and synchronization function 30 of central office modem 12 receives, from the remainder of headend 2, the digital data to be transmitted over the CATV network. Interleaver and synchronization function 30 performs convolutional interleaving according to the conventional technique, to disperse the effects of any burst error events over the communicated datastream, and synchronizes the transmission frequency with a master clock (not shown) within central office modem 12. These interleaved and synchronized data are forwarded to encoder 28 which, according to the preferred embodiment of the invention, encodes the data words in a particularly beneficial manner from an error and coding gain standpoint, as will now be described relative to FIG. 8.

Figure 8:
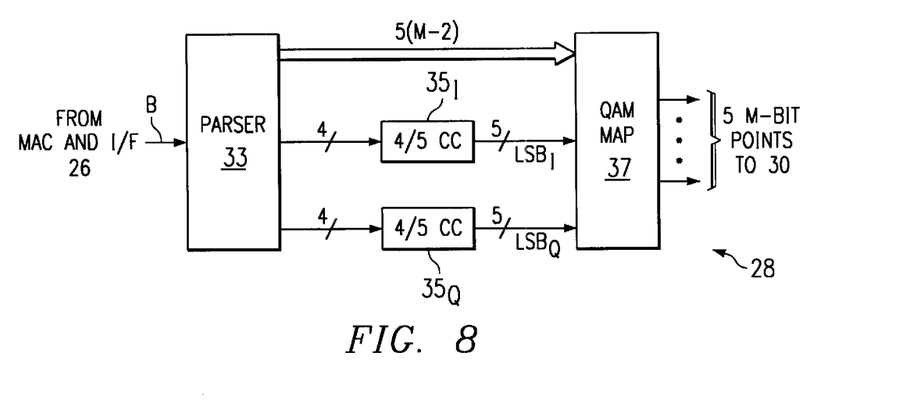
FIG. 8 is an electrical diagram, in block form, of an encoder in the cable modem of FIG. 7 according to the preferred embodiments of the invention.

Encoder 28, as shown in FIG. 8, receives bitstream B from MAC and interface function 26, at parser function 33.

According to this embodiment of the invention, parser function 33 processes the incoming bitstream into groups of 5(m−2)+8 bits, where m corresponds to the number of bits in each encoded symbol. Of course, as is well-know in the art, the grouping of bits carried out by parser function 33 need not have any relationship to the word width of the data words to be communicated from the host computer, as the symbols will be rearranged upon receipt. One portion of each group of bits are forwarded by parser function 33 directly to QAM map function 37; in this example, these uncoded bits are 5(m−2) in number. Alternatively, these uncoded bits (in the convolutional coding sense) may be encoded according to another technique prior to application to QAM map function 37, such as Reed-Solomon coding, as described in Wei, "Two-Level Coding Based on Trellis-Coded Modulation and Reed-Solomon Codes", *IEEE Trans. on Communications,* Vol. 42, No. 12 (December, 1994), pp. 3098–3108.

Parser function 33, in this embodiment of the invention, forwards four bits to each of convolutional coders 35$_I$ and 35$_Q$. Coders 35$_I$ and 35$_Q$ each encode its received four bits into five bits; the five output bits from each coder 35 corresponds to one of the two least significant bits in one of five symbols mapped by QAM map function 37. These LSBs from coders 35$_I$ and 35$_Q$ respectively correspond to the LSB in the in-phase and quadrature selection of one of four sub-constellations, in similar manner as described above relative to FIG. 1.

Figure 9A:
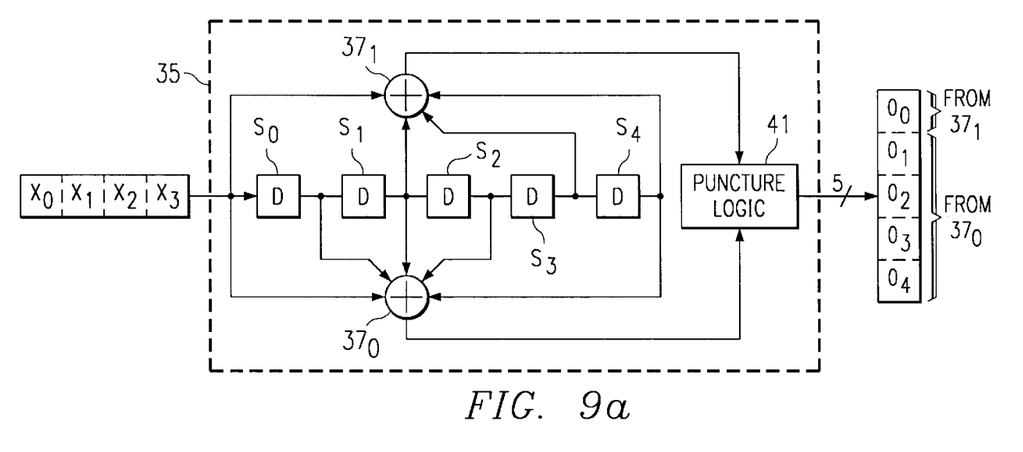
FIGS. 9a and 9b are electrical diagrams, in schematic form, of the convolutional coders of the encoder of FIG. 8 according to first and second preferred embodiments of the invention, respectively.

The construction of coders 35$_I$ and 35$_Q$ according to a first preferred embodiment of the invention will now be described relative to FIG. 9a; while only one of coders 35$_I$ and 35$_Q$ are illustrated in FIG. 9a, it is of course to be understood that this construction will apply to both coders 35$_I$ and in this first embodiment. As illustrated in FIG. 9a, a sequence of four input bits $x_0$ through $x_3$ are serially presented (bit $x_3$ being earliest in time, and bit $x_0$ latest) to convolutional coder 35, from parser function 33 as shown in FIG. 8.

In this embodiment of the invention, convolutional coder 35 is implemented as a finite state machine having thirty-two states. As such, coder 35 includes five delay stages $S_0$ through $S_4$, the outputs of which are applied to exclusive-OR functions 37$_0$ and 37$_1$ according to the encoding of this first embodiment of the invention. In this example, exclusive-OR function 37$_0$ receives the outputs of four selected delay stages $S_0$, $S_1$, $S_2$, and $S_4$, in combination with the currently applied input bit. This selection corresponds to a generator map of $111101_2$ (or $75_8$), using the nomenclature of the above-referenced U.S. Pat. No. 5,511,082. Exclusive-OR function 37$_1$ receives the currently applied input bit, and also the outputs of three selected delay stages $S_1$, $S_3$, and $S_4$, which corresponds to a generator map of $101011_2$ (or $53_8$).

The outputs of exclusive-OR functions 37 are applied to puncture logic 41, which selects the bits to be output by coder 35 according to a puncture scheme. In this example, puncture logic 41 selects the first output bit of exclusive-OR function 37$_1$ generated from the sequence of four input bits $x_0$ through $x_3$, and ignores the next three output bits therefrom; puncture logic 41 also selects each of the four bits output by exclusive-OR function 37$_0$ generated from the sequence of four input bits $x_0$ through $x_3$. One may express this selection of the generated bits by the following puncture map:

$$\begin{pmatrix} 1 & 0 & 0 & 0 \\ 1 & 1 & 1 & 1 \end{pmatrix}$$

As such, puncture logic 41 produces a total of five output bits from the input sequence of four bits. These five output bits are illustrated as bits $O_0$ through $O_4$ in FIG. 9a, with output bit $O_0$ derived by exclusive-OR function 37$_1$ and output bits $O_1$ through $O_4$ derived in sequential order (bit $O_1$ being earliest in time) by exclusive-OR function 37$_0$. Output bit $O_0$ is derived by exclusive-OR function 37$_1$ at a time coincident with bit $O_1$ from exclusive-OR function 37$_0$.

Using similar nomenclature as discussed above relative to FIG. 3, where the initial states of delay stages $S_0$ through $S_4$ are referred to by their delay stage reference $S_x$, the logical dependence of output bits O as a function of the initial state bits S and inputs may be readily derived as follows:

$O_0 = x_3 \oplus S_1 \oplus S_3 \oplus S_4$ $O_1 = x_3 \oplus S_0 \oplus S_1 \oplus S_2 \oplus S_4$ $O_2 = x_2 \oplus x_3 \oplus S_0 \oplus S_1 \oplus S_3$ $O_3 = x_1 \oplus x_2 \oplus x_3 \oplus S_0 \oplus S_2$ $O_4 = x_0 \oplus x_1 \oplus x_2 \oplus x_3 \oplus S_1$ Given these relationships, one may readily derive a state table for coder 35 according to this first preferred embodiment of the invention. Indeed, given such a state table, encoder 35 may be readily implemented into a DSP or other high-performance logic circuit by way of a look-up table or other such construction. In the case of a look-up table in memory, addresses thereto would be derived from the current state of input bits $x_0$ through $x_3$ in combination with the initial state that is set by previous values of input bits x.

It can be readily derived, by those of ordinary skill in the art having reference to this specification, that the code implemented by coder 35 of FIG. 9a has a minimum Hamming distance $d_{free}$ of 4. As described above relative to FIGS. 2 and 3, the conventional 4/5 convolutional coders have a minimum Hamming distance $d_{free}$ of 3. As such, the 4/5 convolutional coder 35 according to this first preferred. embodiment of the invention provides an improvement in coding gain of 4/3, or 1.25 dB, over that of the conventional trellis coding of FIGS. 2 and 3. In addition, as evident from the foregoing description, coder 35 has a code rate of 4/5, identically to the conventional case described above. Considering that the coding gain of that conventional approach is 4.07 dB, as described above, the performance of the trellis coding arrangement of this first preferred embodiment of the present invention is increased to 5.32 dB. As such, this preferred embodiment of the invention provides error reduction in the coded LSBs of the parsed datawords to an extent that virtually matches the increased Euclidean distance between uncoded constellation points, of 2d.

As noted above, convolutional coder 35 according to this first preferred embodiment of the invention requires a finite state machine having thirty-two states, rather than the sixteen states of the prior art convolutional coder. It is contemplated, however, that this increase in complexity of the convolutional coder will have little impact in the cost or complexity of operation of cable modem 10 embodying the same, especially considering the processing capability provided by modem cable modem technology.

It has been observed, according to the present invention, that the convolutional coding provided by coder 35 described hereinabove relative to FIG. 9a, while providing a full additional bit of minimum Hamming distance $d_{free}$, has a large number of "nearest neighbors" in its trellis. In other words, this coding approach has seven equally likely error paths in departing and returning to a given state (each, of course, requiring four errors). More rigorously, the transfer function for this approach may be expressed as:

$$7D^4+54D^5+307D^6+\ldots$$

which indicates the presence of seven four-error paths that depart from and return to a given state. In contrast, as noted above, the conventional sixteen-state 4/5 convolutional coder described hereinabove has a transfer function of:

$$2D^3+10D^4+78D^5+528D^6+\ldots$$

which indicates that two three-error paths can be followed from and back to a given state. While the increase in minimum Hamming distance $d_{free}$ provided by the coder of FIG. 9a provides significant improvement over the conventional ($d_{free}$=3) coding, it may be preferable, in some applications, to provide such coding with fewer "nearest neighbor" trellis paths.

Figure 9B:
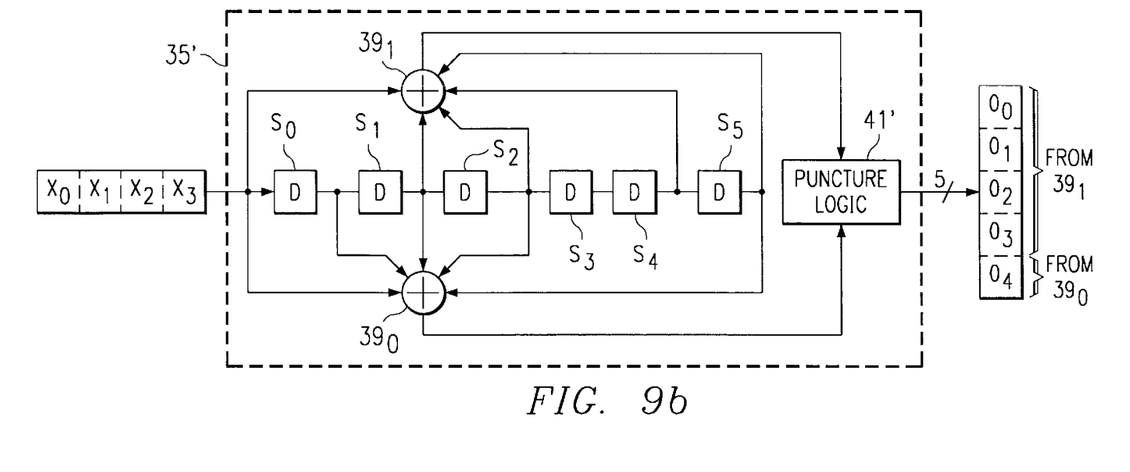

Referring now to FIG. 9b, the construction of 4/5 convolutional coder 35' according to a second preferred embodiment of the present invention will now be described. This coder 35' is a sixty-four state convolutional coder, and as such includes six delay stages $S_0$ through $S_5$ connected in sequence to the input of coder 35'. Exclusive-OR function $39_0$ receives the outputs of four selected delay stages $S_0$, $S_1$, $S_2$, and $S_5$, in combination with the currently applied input bit. As such, the combination applied by exclusive-OR function $39_0$ may be expressed as generator $1111001_2$ (or $171_8$). Exclusive-OR function $39_1$ receives the currently applied input bit, in combination with the outputs of four selected delay stages $S_1$, $S_2$, $S_4$, and $S_5$, corresponding to a generator of $1011011_2$ (or $133_8$).

In this second preferred embodiment of the present invention, puncture logic 41' selects the bits to be output by coder 35' according to another puncture scheme, in which the first output bit of exclusive-OR function $39_0$ generated from the sequence of four input bits $x_0$ through $x_3$ is selected and the next three output bits therefrom are ignored, and in which each of the four bits output by exclusive-OR function $39_1$ so generated from the sequence of four input bits $x_0$ through $x_3$ are selected. A corresponding puncture map for this scheme may be expressed as:

$$\begin{Bmatrix} 1 & 1 & 1 & 1 \\ 1 & 0 & 0 & 0 \end{Bmatrix}$$

Puncture logic 41' thus selects a total of five output bits from the eight possible bits generated from the input sequence of four bits. These five output bits are illustrated as bits $O_0$ through $O_4$ in FIG. 9b, with output bit $O_4$ derived by exclusive-OR function $39_0$ and output bits $O_0$ through $O_3$ derived in sequential order (bit $O_0$ being earliest in time) by exclusive-OR function $39_1$. Output bit $O_0$ is derived by exclusive-OR function $39_1$ at a time coincident with bit $O_5$ from exclusive-OR function $39_0$.

Referring to the initial states of delay stages $S_0$ through $S_5$ by their corresponding delay stage reference $S_x$, the logical dependence of output bits O as a function of the initial state bits S and inputs x may be readily derived as follows:

$$O_0 = x_3 \oplus S_1 \oplus S_2 \oplus S_4 S_5$$

$$O_1 = x_2 \oplus S_0 \oplus S_1 \oplus S_3 S_4$$

$$O_2 = x_1 \oplus x_3 \oplus S_0 \oplus S_2 S_3$$

$$O_3 = x_0 \oplus x_2 \oplus x_3 \oplus S_1 S_2$$

$$O_4 = x_3 \oplus S_0 \oplus S_1 \oplus S_2 S_5$$

Given these relationships, one may also readily derive a state table for coder 35' according to this second preferred embodiment of the invention; as noted above, such a state table may then be readily implemented into a DSP or other high-performance logic circuit by way of a look-up table or other such construction. As noted above, implementation of the convolutional coders by way of a look-up table in memory would address such a table according to the current state of input bits $x_0$ through $x_3$ in combination with those previous values of input bits x that set the state of the state machine.

It can be readily derived, by those of ordinary skill in the art having reference to this specification, that the minimum Hamming distance $d_{free}$ of the code implemented by coder 35' of FIG. 9a also has the value 4, which is also an improvement over the $d_{free}$ of 3 provided by the conventional convolutional coder of FIGS. 2 and 3, and as such this second embodiment of the invention also provides a coding gain of 4/3, or 1.25 dB, over the conventional approach. In addition, one may readily derive the transfer function of 4/5 convolutional coder 35' according to this second preferred embodiment of the invention as:

$$3D^4+24D^5+172D^6+\ldots$$

which indicates the presence of only three four-error paths that depart from and return to a given state. This robustness provided by fewer "nearest neighbors" of coder 35' according to this second preferred embodiment of the invention may be sufficiently important in some applications to justify the incremental cost of providing sixty-four states in the finite state machine realization of coder 35'. It is contemplated that the selection between the thirty-two state coder 35 and the sixty-four state coder 35', given the desired error performance, may be readily made by those of ordinary skill in the art having reference to this specification.

Referring back to FIG. 8, the outputs of coders $35_I$, $35_Q$, whether implemented by way of thirty-two state coder 35 or sixty-four state coder 35' described herein, are forwarded to QAM map function 37 in combination with the 5(m−2) uncoded bits from parser function 33. QAM map function 37 then arranges these bits into five m-bit constellation points, or symbols, and arranges these symbols into a temporal sequence relative to one another. In this regard, the particular sub-constellation of each of these five points is selected by QAM map function 37 using a corresponding one of the five output bits $LSB_I$ from convolutional coder $35_I$ as the least significant in-phase bit for selecting the sub-constellation, and a corresponding one of the five output bits $LSB_Q$ from convolutional coder $35_Q$ as the least significant quadrature bit for sub-constellation selection. In this regard, the output bits from coders $35_I$, $35_Q$ select one of four sub-constellations for the QAM coding, with this selection made in similar manner as that described hereinabove relative to the 16-QAM case of FIG. 1.

Referring back to FIG. 7, the construction of the transmit side of central office modem 12 downstream from encoder 28, according to the preferred embodiment of the invention, will now be described. The encoded data output of encoder 28 is a sequence of the appropriate data words to be modulated by QAM modulator function 34, which in turn converts the coded constellation points generated by encoder 28 into in-phase and quadrature (i.e., complex) values. Accordingly, the modulated signals generated by modulator 34 are modulated both in phase and in amplitude, the modulation of signals both in phase and in amplitude is generally referred to in the art as "quaternary amplitude modulation", or QAM. These complex values of the modulated signals are converted into analog signals of the appropriate amplitude and phase signals by RF interface 14, which includes the appropriate digital-to-analog conversion (DAC) function therein. The upstream signal is then applied to the CATV network by central office modem 12, and forwarded to cable modem 10 over downstream facility DS as illustrated in the exemplary system arrangement of FIG. 7.

This downstream signal is received by the addressed cable modem 10. In the example of FIG. 7, cable modem 10 interfaces with downstream facility DS of the CATV network by way of radio frequency (RF) interface 14'. RF interface 14' effectively operates as a splitter, and is thus in communication with both the transmit and receive sides of cable modem 10. In this regard, RF interface 14' includes an analog-to-digital conversion (ADC) function, by way of which the incoming analog signals are sampled and digitized for processing by the receive side of cable modem 10. On this receive side, timing recovery function 16 recovers a clock signal from the incoming signals, relative to a high-precision external crystal oscillator clock in the conventional manner. Demodulation function 18 operates to demodulate the received signal which, as noted above, is modulated both in phase and in amplitude (i.e., as a QAM signal); demodulation function 18 thus provides a sequence of digital words to equalization function 20. Equalization function 20 filters this symbol sequence to compensate for signal distortion introduced by the communications channel; typically, the digital filter applied by equalization function 20 is set by cable modem 10, in combination with central office modem 12 with which it is in communication, during the initialization of the communications session, by way of the transmittal and receipt of a known training signal or by way of an adaptive equalization approach. In addition to equalization, equalization function 20 may also carry out such operations as useful in correcting for frequency and phase offset between the RF portions of the transmitting modem and the receive side of cable modem 10 itself.

Decoding and de-interleaving function 24 according to this embodiment of the invention reverses the encoding and interleaving used in the transmission of the signal. The decoding performed by function 24, according to this embodiment of the invention, includes Viterbi decoding for recovering the data words from codewords including both uncoded and convolutionally coded bits, as described above. Additionally, as described in the Wei paper to which reference is made hereinabove, the "uncoded" bits may have been subjected to Reed-Solomon coding for additional error reduction, in which case decoding function 24 would execute the appropriate Reed-Solomon decoding operation. Further, decoding function 24 reverses the convolutional interleaving that was applied to the transmitted signal at central office modem 12. The decoded output from function 24 is forwarded to media access control MAC and interface function 26', which performs the appropriate MAC functions upon the received signal and interfaces with the host computer of cable modem 10.

As noted above, the coding approach according to the preferred embodiments of the invention is most advantageously applied, in cable modem communication, to the "downstream" traffic from central office modem 12 to cable modem 10. However, as is known in the art and as described above, upstream communication from cable modem 10 to central office modem 12 is also carried out. As such, each of modems 10, 12 include the appropriate upstream functionality which may be constructed and operated according to conventional techniques; of course, the coding approach described hereinabove for downstream traffic according to the present invention may also be utilized for this upstream traffic. These functions of modems 10, 12 are illustrated in FIG. 7 for the sake of completeness. More specifically, cable modem 10 includes upstream transmit encoding and modulation function 27 which encodes and modulates the upstream digital data generated by the host computer and processed by media access control MAC and interface function 26'. The output of encoding and modulation function 27 is applied to RF interface 14', which performs the appropriate digital-to-analog conversion and other signal formatting and processing, prior to applying the upstream signal to upstream facility UP. Conversely, central office modem 12 includes upstream receive decoding and demodulation function 25, which receives the upstream traffic from upstream facility UP via RF interface 14 (including A/D conversion performed thereby). Decoding and demodulation function 25 effectively reverses the processing performed by upstream transmit encoding and modulation function 27, applying the digital output to media access control and interface 26 for forwarding to headend 2, thus completing the bidirectional loop.

Figure 10:
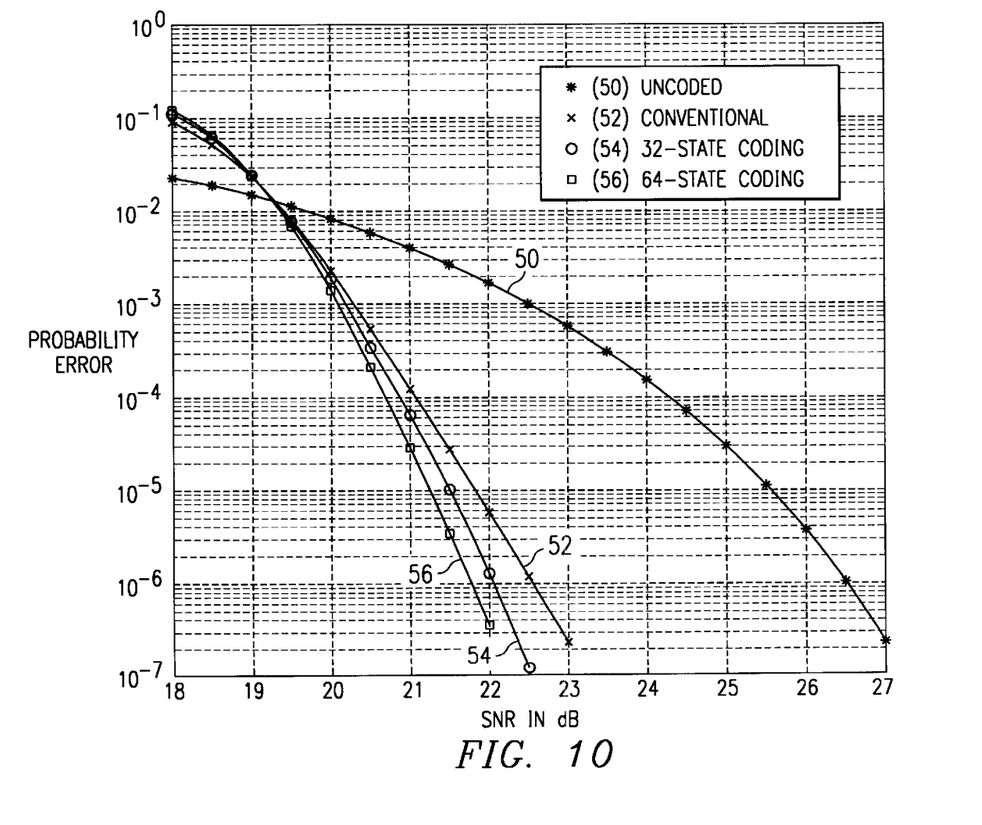
FIG. 10 is a simulation plot of error probability to signal-to-noise ratio for uncoded transmission, conventional coding, and coding according to the first and second preferred embodiments of the invention.

Referring now to FIG. 10, simulation results illustrating the important improvement in effective coding gain provided by the preferred embodiments of the invention will now be described. As illustrated therein, plot 50 is a simulation plot of the probability of error as a function of signal-to-noise ratio for the uncoded case, i.e. where no convolutional coding is provided. Plot 52 is a simulation of the error probability over signal-to-noise ratio for the conventional convolutional coding described hereinabove relative to FIG. 3 which, as expected, provides a significant amount of improvement over the uncoded case, in that a much lower signal-to-noise ratio may be tolerated for the same error probability.

Plot 54 illustrates the simulated performance of the thirty-two state convolutional coding described hereinabove relative to the first preferred embodiment of the present invention. As illustrated in FIG. 10, significant performance improvement is provided by this coding approach. For example, at an error probability of $10^{-5}$ (which is a typical specified error level), the thirty-two state convolutional coding described hereinabove relative to the first preferred embodiment of the invention. can operate at a signal-to-noise ratio of 21.5 dB, nearly 0.5 dB better than that provided by the conventional coding of FIG. 3 (and indicated by plot 52). Plot 56 illustrates the simulated performance of the sixty-four state convolutional coding described hereinabove relative to the second preferred embodiment of the present invention; as indicated in FIG. 10, approximately a 0.75 dB improvement in the permitted signal-to-noise ratio, at an error probability of $10^{-5}$, is provided by this embodiment of the invention relative to the conventional coding approach performance of plot 52. At lower error probabilities, the gain improvement provided by the preferred embodiments of the invention relative to the conventional approach becomes even more dramatic.

According to the present invention, therefore, it is contemplated that significant improvement in the ability of the encoding of digital data for communication over high-data-rate communications facilities, such as those provided by the CATV network and using cable modem communications, may be provided. This improvement is manifest by way of a significant reduction in error probability for a given signal-to-noise ratio, and is obtained by way of a relatively modest increase in the complexity of convolutional coder functionality. The present invention may be readily implemented by way of a digital signal processor routine, or alternatively by way of custom hardware if desired. Furthermore, the present invention is readily backward-compatible with reduced complexity convolutional coding techniques, facilitating the implementation of the present invention into current cable modem systems.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A communications device for transmitting data signals over a communications facility, comprising:
    a computer interface for receiving data words corresponding to data signals to be transmitted;
    an encoder, comprising:
        a first convolutional coder, coupled to the computer interface to receive a first selected subset of a group of digital bits;
        a second convolutional coder, coupled to the computer interface to receive a second selected subset of the group of digital bits; and
        a phase and amplitude modulation map function for arranging digital symbols into points of a phase and amplitude modulation constellation, each constellation point corresponding to a digital value, the phase and amplitude modulation map function coupled to the computer interface to receive a group of digital bits therefrom that are not coded by the first and second convolutional coders, and coupled to the first and second convolutional coders to receive coded digital bits therefrom;
        wherein the first and second convolutional coders each comprise a finite state machine having at least thirty-two states, and are for respectively generating first and second groups of coded bits by way of a convolutional coding scheme, the first and second groups of coded bits each having more bits than the first and second subsets, respectively, and wherein the convolutional coding scheme has a minimum Hamming distance of four;
    a modulator, coupled to the encoder, for generating a phase and amplitude modulated signal responsive to the points of the phase and amplitude modulation constellation; and
    a network interface, coupled to the modulator, for driving a communications facility with the modulated signal.

2. The device of claim 1, wherein the phase and amplitude modulation map function assigns one bit of each of the first and second groups of coded bits to each constellation point.

3. The device of claim 2, wherein the phase and amplitude modulation constellation comprises four sub-constellations; and wherein the phase and amplitude modulation map function selects one of the four sub-constellations for each constellation point responsive to the value of the assigned one bit of each of the first and second groups of coded bits.

4. The device of claim 1, wherein the finite state machines of each of the first and second convolutional coders have thirty-two states.

5. The device of claim 4, wherein the finite state machines of each of the first and second convolutional coders comprise:
    a sequence of delay stages connected to an input;
    first and second exclusive-OR generators coupled to the input and to selected ones of the delay stages; and
    puncture logic, for masking selected ones of output signals from the first and second exclusive-OR generators.

6. The device of claim 5, wherein the first exclusive-OR generator has a generator map of $111101_2$;
    wherein the second exclusive-OR generator has a generator map of $101011_2$;
    and wherein the puncture logic has a puncture map of:

$$\left\{ \begin{matrix} 1 & 0 & 0 & 0 \\ 1 & 1 & 1 & 1 \end{matrix} \right\}.$$

7. The device of claim 1, wherein the finite state machines of each of the first and second convolutional coders have sixty-four states.

8. The device of claim 7, wherein the finite state machines of each of the first and second convolutional coders comprise:
    a sequence of delay stages connected to an input;
    first and second exclusive-OR generators coupled to the input and to selected ones of the delay stages; and
    puncture logic, for masking selected ones of output signals from the first and second exclusive-OR generators.

9. The device of claim 8, wherein the first exclusive-OR generator has a generator map of $1111001_2$;
    wherein the second exclusive-OR generator has a generator map of $1011011_2$;
    and wherein the puncture logic has a puncture map of:

$$\left\{ \begin{matrix} 1 & 1 & 1 & 1 \\ 1 & 0 & 0 & 0 \end{matrix} \right\}.$$

10. The device of claim 1, wherein the communications facility comprises a cable television network communications facility.

11. A method of encoding digital information for transmission over a communications facility, comprising the steps of:
    receiving the digital information in a bitstream; for each of a plurality of groups of bits in the received bitstream:
        applying a convolutional code of at least thirty-two states to a first subset of the group of bits, the convolutional code having a minimum Hamming distance of four, to generate a first set of coded bits;
        applying a convolutional code of at least thirty-two states to a second subset of the group of bits, the convolutional code having a minimum Hamming distance of four, to generate a second set of coded bits, the first and second sets of coded bits having the same number of bits;
        combining one bit from each of the first and second sets of coded bits to at least one of the group of bits not in the first and second subsets to form a plurality of constellation points in a phase and amplitude modulation constellation; and generating a phase and amplitude modulated signal responsive to a sequence of the plurality of constellation points.

12. The method of claim 11, wherein the phase and amplitude modulation constellation comprises a plurality of sub-constellations;

and wherein the combining step comprises:

for each constellation point, selecting one of the sub-constellations responsive to the value of the combined one bit from each of the first and second sets of coded bits.

13. The method of claim 11, wherein the steps of applying a convolutional code each comprise:

sequentially shifting the subset of bits into a sequence of delay stages, the delay stages storing a previous state before commencement of the shifting;

generating first and second exclusive-OR sequences from a combination of the shifted subset of bits and the contents of the delay stages; and selecting bits of the first and second exclusive-OR sequences to form the set of coded bits.

14. The method of claim 13, wherein the sequence of delay stages includes at least five delay stages;

wherein the first and second exclusive-OR sequences are generated according to generator maps of $111101_2$ and $101011_2$, respectively; and wherein the selecting steps selects bits of the first and second exclusive-OR sequences according to a puncture map of:

$$\begin{Bmatrix} 1 & 0 & 0 & 0 \\ 1 & 1 & 1 & 1 \end{Bmatrix}.$$

15. The method of claim 14, wherein the shifting, generating, and selecting steps are performed by accessing a look-up table using addresses corresponding to current values of the received subset of bits, and previous values of the received subset of bits.

16. The method of claim 13, wherein the sequence of delay stages includes at least six delay stages;

wherein the first and second exclusive-OR sequences are generated according to generator maps of $1111001_2$ and $1011011_2$, respectively;

and wherein the selecting steps selects bits of the first and second exclusive-OR sequences according to a puncture map of:

$$\begin{Bmatrix} 1 & 1 & 1 & 1 \\ 1 & 0 & 0 & 0 \end{Bmatrix}.$$

17. The method of claim 16, wherein the shifting, generating, and selecting steps are performed by accessing a look-up table using addresses corresponding to current values of the received subset of bits, and previous values of the received subset of bits.

* * * * *